(12) United States Patent
Sohn et al.

(10) Patent No.: US 9,593,278 B2
(45) Date of Patent: *Mar. 14, 2017

(54) PHOSPHOR AND LIGHT-EMITTING DEVICE INCLUDING SAME

(71) Applicant: INDUSTRY-ACADEMY COPERATION CORPS OF SUNCHON NATIONAL UNIVERSITY, Jeollanam-do (KR)

(72) Inventors: Kee-Sun Sohn, Suncheon-si (KR); Un-Bae Park, Suncheon-si (KR)

(73) Assignee: INDUSTRY-ACADEMY COPERATION CORPS OF SUNCHON NATIONAL UNIVERSITY, Suncheon-si, Jeollanam-do (KR)

( * ) Notice: Subject to any disclaimer, the term of this patent is extended or adjusted under 35 U.S.C. 154(b) by 80 days.

This patent is subject to a terminal disclaimer.

(21) Appl. No.: 14/410,560

(22) PCT Filed: Mar. 25, 2013

(86) PCT No.: PCT/KR2013/002447
§ 371 (c)(1),
(2) Date: Dec. 22, 2014

(87) PCT Pub. No.: WO2013/191358
PCT Pub. Date: Dec. 27, 2013

(65) Prior Publication Data
US 2015/0275081 A1 Oct. 1, 2015

(30) Foreign Application Priority Data
Jun. 22, 2012 (KR) .................. 10-2012-0067260

(51) Int. Cl.
*C09K 11/08* (2006.01)
*C09K 11/77* (2006.01)
*C09K 11/79* (2006.01)
*H05B 3/02* (2006.01)
*H01L 33/50* (2010.01)

(52) U.S. Cl.
CPC ...... *C09K 11/7792* (2013.01); *C09K 11/0883* (2013.01); *C09K 11/7734* (2013.01); *H01L 33/502* (2013.01)

(58) Field of Classification Search
CPC .................................................. C09K 11/7792
See application file for complete search history.

(56) References Cited

U.S. PATENT DOCUMENTS

| 6,284,156 | B1 | 9/2001 | Uehara et al. |
| 9,133,393 | B2* | 9/2015 | Sohn .................. C09K 11/0883 |
| 2004/0135504 | A1 | 7/2004 | Tamaki et al. |
| 2009/0033201 | A1 | 2/2009 | Shimooka et al. |
| 2013/0181164 | A1 | 7/2013 | Sohn et al. |

FOREIGN PATENT DOCUMENTS

| JP | 2000-212556 A | 8/2000 |
| JP | 2008-189811 A | 8/2008 |
| JP | 2008-199053 A | 8/2008 |
| KR | 10-2004-0093374 A | 11/2004 |
| KR | 10-1215300 B1 | 12/2012 |
| WO | WO 2012/134043 | * 10/2012 |

OTHER PUBLICATIONS

International Search Report for PCT/KR2013/002447 mailed Jul. 22, 2013 from Korean Intellectual Property Office.

* cited by examiner

*Primary Examiner* — Carol M Koslow
(74) *Attorney, Agent, or Firm* — Revolution IP, PLLC (57) ABSTRACT

Provided is a phosphor including: a host material expressed by a general formula $(Ca_{1-x}Me_x)a(Ce_{1-y-z}La_yPr_z)bSicXd$ ($0.5 \leq b/a \leq 7$, $1.5 \leq c/(a+b) \leq 3.5$, $4 \leq d/(a+b) \leq 6$, $0 \leq x \leq 0.5$, $0 \leq y < 1$, $0 \leq z \leq 0.5$, and $0 \leq y+z < 1$, where X is at least one element selected from N, O, F, and Cl); and at least one activator that is selected from Mn, Ce, Pr, Nd, Sm, Eu, Gd, Dy, Tb, Ho, Er, Tm, and is solid-solutioned in the host material, wherein Me is at least one element selected from Ba, Mg, Sr, Mn, and Zn, and the host material includes, as a main phase, a phase that exhibits a diffraction peak having a relative intensity of 5% or more in ranges of Bragg's angles ($2\theta$) of 10.68-11.41°, 18.52-19.46°, 31.21-31.58°, 31.61-32.20°, and 36.81-37.49° of an X-ray diffraction pattern when a relative intensity of a diffraction peak having the strongest intensity is set to 100% in the X-ray powder diffraction pattern.

10 Claims, 4 Drawing Sheets

PHOSPHOR AND LIGHT-EMITTING DEVICE INCLUDING SAME

CROSS REFERENCE TO PRIOR APPLICATIONS

This application is a National Stage Application of PCT International Patent Application No. PCT/KR2013/002447 filed on Mar. 25, 2013, under 35 U.S.C. §371, which claims priority to Korean Patent Application No. 10-2012-0067260 filed on Jun. 22, 2012, which are all hereby incorporated by reference in their entirety.

TECHNICAL FIELD

The present invention relates to a phosphor having a novel crystal structure and a light-emitting device using the same, and more particularly, to a phosphor having excellent durability and being capable of emitting light with various colors ranging from green to yellow when a blue light-emitting diode or an ultraviolet light-emitting diode is used as an excitation source.

BACKGROUND ART

Recently, a white light-emitting device (LED), which is getting the lime light as a lighting, an LED backlight, a lighting lamp for vehicle or the like, generally includes a light-emitting element emitting a blue or a near infrared ray, and a phosphor converting a wavelength into a visible ray by using, as an excitation source, light emitted from the light-emitting element.

In a typical method for realizing the white LED, a blue light-emitting element formed of an InGaN-based material having a wavelength of 450-550 nm, is used as a light-emitting element, and a YAG-based phosphor that is expressed by an empirical formula of $(Y,Gd)_3(Al,Ga)_5O_{12}$ and emits a yellow, is used. In the white LED, blue light emitted from the light-emitting element, is incident to a phosphor layer, and the incident blue light is absorbed and scattered several times in the phosphor. At this time, the blue light absorbed in the phosphor is changed in wavelength to be converted into yellow light, the yellow light and a portion of the incident blue light are mixed with each other, and thus the mixed color is visible to human eyes as a white However, the white LED having the aforementioned structure has limitations in that light is low in red component, color temperature is high, and red and green components are insufficient, so only illumination light having a low degraded color rendering property, is obtained.

Also, since an oxide-based phosphor generally shows a tendency that when a wavelength of an excitation source decreases to 400 nm, a light-emitting intensity is reduced, the oxide-based phosphor has a limitation in that high brightness white light is unobtainable by using blue light.

Therefore, an oxynitride-based phosphor, which has stability equal to or more than that of an oxide-based phosphor, and also has excellent light-emitting efficiency even in an excitation source having a wavelength of more than 450 nm, is receiving attention from a white LED field. Also, since the oxynitride-based phosphor is a material that has been originally developed from engineering ceramic, the oxynitride-based phosphor has advantages in that an efficiency reduction and a color conversion due to humidity and heat are low.

However, it is little studied or known about existence of the oxynitride-based phosphor in a composition region deviated from α-type or β-type SiAlON (Si—Al—O—N).

DISCLOSURE OF THE INVENTION

Technical Problem

The purpose of the present invention is to provide a phosphor that has excellent structural stability, excellent light-emitting brightness particularly at a yellow color, is deviated from the component region of a typical SiAlON phosphor, has a novel crystal structure for easily improving the light-emitting brightness, has a wide light-emitting peak, and especially, is suitably used in an LED field.

The purpose of the present invention is also to provide a light-emitting device including the phosphor described above.

Technical Solution

The present inventor has studied a novel phosphor composition that is formed of oxynitride just like a SiAlON phosphor to have structural stability, excellent durability, and excellent brightness and thus to be applicable to a phosphor for a lighting, such as an LED, consequently, has found that a specific composition composed of Ca, Ce, and Si, forms an inorganic crystal structure of a monoclinic system that is low in symmetry, (La can be optionally included in the specific composition), and a phosphor including a host material having the inorganic crystal structure, emits light from green to yellow at high brightness, and thus has completed the present invention.

The present invention aims to provide a phosphor including: a host material expressed by a general formula $(Ca_{1-x}Me_x)_a(Ce_{1-y-z}La_yPr_z)_bSi_cX_d$ ($0.5 \leq b/a \leq 7$, $1.5 \leq c/(a+b) \leq 3.5$, $4 \leq d/(a+b) \leq 6$, $0 \leq x \leq 0.5$, $0 \leq y < 1$, $0 \leq z \leq 0.5$, and $0 \leq y+z < 1$, where X is at least one element selected from N, O, F, and Cl); and at least one activator that is selected from Mn, Ce, Pr, Nd, Sm, Eu, Gd, Dy, Tb, Ho, Er, Tm, and is solid-solutioned in the host material, wherein Me is at least one element selected from Ba, Mg, Sr, Mn, and Zn, and the host material comprises, as a main phase, a phase that exhibits a diffraction peak having a relative intensity of 5% or more in ranges of Bragg's angles (2θ) of 10.68-11.41°, 18.52-19.46°, 31.21-31.58°, 31.61-32.20°, and 36.81-37.49° of a powder X-ray diffraction pattern when a relative intensity of a diffraction peak having the strongest intensity is set to 100% in the powder X-ray diffraction pattern.

The main phase may have a crystal structure of a monoclinic system.

The host material may have a crystal lattice that has reference values of a=18.4882 Å, b=4.83587 Å, c=10.67235 Å, α=γ=90°, and β=108.2424° according to a peak of the powder X-ray diffraction pattern, wherein the a, b, c and β values are changed in a range of ±5% or less from the reference values.

The "b" may be 0.8a to 2a, and the "c" may be 1.8(a+b) to 3.2(a+b).

The "X" may include O and N, wherein a molar ratio (N/O) of the O and N is a range of 4 to 8.

The activator may include Eu.

The "x" may be 0 to 0.5, and the "z" may be 0 to 0.5.

The activator may be included in a molar ratio of 0.1 with respect to the host material.

The phosphor may emit light having a wavelength of 500 nm to 600 nm when an excitation source having a wavelength of 360 nm to 500 nm is irradiated thereon.

The present invention also aims to provide a light-emitting device including any one of the phosphors.

Advantageous Effects

There has been no report on a phosphor host composition that is based on Ca, Ce, and Si, (La, O, or N can be optionally included in the composition), and has a monoclinic crystal structure. The composition may be used as blue, greenish yellow, and yellow phosphor when activators, such as Eu, Mn or the like, are doped thereinto, especially, have excellent light efficiency when Eu is doped thereinto, and be suitably used as a phosphor for an LED.

Since the phosphor of the invention is formed of oxynitride to have excellent structural stability, the phosphor shows excellent stability under an oxidation atmosphere or an environment containing moisture, and since the phosphor has a well-organized monoclinic crystal structure that is low symmetry, a radiationless deactivation in which excited electrons emit heat to return back to a ground state, is restrained. Thus, the light-emitting efficiency may be increased and good luminance properties may be obtained.

In addition, the wavelength of the light may be changed from green to yellow by replacing Ca, La site with a material having the same oxidation number by controlling the molar ratio of the constituting elements in the phosphor of the present invention. In addition, the light-emitting efficiency may be changed, and the wavelength of the emitted light may be changed according to the Eu doping concentration. Further, the phosphor of the present invention may be used as a phosphor for tuning.

MODE FOR CARRYING OUT THE INVENTION

Hereinafter, Examples of the present invention will be described in detail.

Phosphor

A phosphor according to the present invention includes: a host material expressed by a general formula of $(Ca_{1-x}Me_x)_a(Ce_{1-y-z}La_yPr_z)_bSi_cX_d$ ($0.5 \leq b/a \leq 7$, $1.5 \leq c/(a+b) \leq 3.5$, $4 \leq d/(a+b) \leq 6$, $0 \leq x \leq 0.5$, $0 \leq y < 1$, $0 \leq z \leq 0.5$, and $0 \leq y+z < 1$, where X is at least one selected from N, O, F, and Cl); and at least one activator that is selected from Mn, Ce, Pr, Nd, Sm, Eu, Gd, Dy, Tb, Ho, Er and Tm, and is solid-solutioned in the host material, wherein Me is at least one element selected from Ba, Mg, Sr, Mn, and Zn, and the host material includes, as a main phase, a phase that exhibits a diffraction peak having a relative intensity of 5% or more in ranges of Bragg's angles (2θ) of 10.68-11.41°, 18.52-19.46°, 31.21-31.58°, 31.61-32.20°, and 36.81-37.49° of an X-ray diffraction pattern when a relative intensity of a diffraction peak having the strongest intensity is set to 100% in the X-ray powder diffraction pattern.

In the present invention, the main phase means a material that occupies 50% or more parts by volume among materials composing a phosphor composition. Also, in the present invention, the relative intensity of the diffraction peak is a value derived from the following Formula.

Relative Intensity (%)=(Relevant Peak Intensity/Maximum Peak Intensity)×100

The phosphor according to the present invention is a phosphor that contains Ca, Ce, and Si, (La can be optionally included), as main components. Also, although a portion of Ca is replaced with Ba, Mg, Sr, Mn and Zn, and a portion of Ce or La is replaced with Pr, the phosphor has a monoclinic crystal structure of which three crystal axes of a, b, and c have different lengths, where the a axis is perpendicular to the b and c axes, but the b axis and the c axis are not perpendicular to each other. In addition to, when Eu or the like is solid-solutioned as a core metal element for emitting light, the phosphor is a composition that emits green, yellowish green or yellow light when an excitation source of an ultraviolet ray or a visible ray is irradiated thereon.

In the phosphor according to the present invention, the main phase is a monoclinic phase.

Also, in the phosphor according to the present invention, the host material has a crystal lattice that has reference values of a=18.4882 Å, b=4.83587 Å, c=10.67235 Å, α=γ=90°, and β=108.2424° according to a peak of a powder X-ray diffraction, where the a, b, c and β values may be changed in a range of ±5% or less from the reference values.

Also, in the phosphor according to the present invention, the "a" is a proportional constant, and may have any value. Meanwhile, the "a" is preferably a range of 1 to 30 when expressed by a general chemical formula through a subsequent accurate structural analysis, and is more preferably in a range of 1 to 10 in consideration of a chemical structure of an existing crystal structure.

In addition to, in the phosphor of the present invention, the "b" is preferably in a range of 0.5a to 7a, and this is because when the b is less than 0.5a or more than 7a, the crystal structure of the phosphor is converted from a monoclinic crystal structure to another crystal structure, and thus the properties of the phosphor according to the present invention may be unobtainable. In consideration of stability of a crystal structure, the "b" is more preferably in a range of 0.8a to 2a.

Further, in the phosphor of the present invention, the "c" is preferably in a range of 1.5(a+b) to 3.5(a+b), and this is because when the "c" is less than 1.5(a+b) or more than 3.5(a+b), the crystal structure of the phosphor is converted from a monoclinic crystal structure to other crystal structures, and thus then properties of the phosphor according to the present invention may be unobtainable. In consideration of stability of a crystal structure, the "c" is more preferably in a range of 1.8(a+b) to 3.2(a+b).

Also, in the phosphor according to the present invention, the "X" may include nitrogen (N) and oxygen (O), at this time, nitrogen (N) may be approximately adjusted by a "c/(a+b)" value, but is impossible to be accurately adjusted. In addition to, in consideration of stability of a crystal structure, the "d" is preferably in a range of 4(a+b) to 6(a+b), just like nitrogen (N), oxygen (O) may be approximately adjusted by a "c/(a+b)" value, but is impossible to be accurately adjusted, so in consideration of stability of a crystal structure, it is preferable that a ratio (N/O) of oxygen (O) and nitrogen (N) be in a range of 4 to 8.

Also, in the phosphor of the present invention, Ba, Mg, Sr and Mn may replace Ca up to 50% of Ca, and this is because when the replacing amount exceeds 50%, a phase having a crystal structure according to the present invention, may be unobtainable, so it is most preferable that the replacing amount be up to 10%.

Further, in the phosphor of the present invention, it is preferable that Pr replaces Ce or La up to 50% of Ce or La, and this is because when the replacing amount exceeds 50%, a luminous intensity is very low and thus the phosphor according to the present invention is difficult to be applied as a phosphor, so it is most preferable that the replacing amount be up to 10%.

Also, in the phosphor according to the present invention, when a solid-solution amount of the activator is less than 0.001a, brightness is not sufficient due to a lack of a light-emitting element, and when the solid-solution amount is more than 0.4a, brightness may rather be reduced due to so-called "the concentration quenching effect". Accordingly, since brightness can be obtained in a range of 0.01a to 0.4a, it is preferable that the solid-solution amount be in the range of 0.01a to 0.4a, and it is more preferably that the activator be solid-solutioned in a molar ratio of 0.03 to 0.07 with the host material. Further, europium (Eu) is most preferable as an activator, and at least one element selected from Mn, Ce, Pr, Nd, Sm, Gd, Tb, Dy, Ho, Er, Tm and Yb may be co-doped into europium (Eu)

Also, it is ideal that the phosphor having a composition according to the present invention be constituted of a single phase, but in manufacturing, a little amount of an inevitable mixture having a non-crystalline phase or other non-monoclinic phase, may be included in the phosphor single phase, and accordingly, only when the mixture do not affect the property of the phosphor, the mixture may be included to some extent.

Furthermore, in the phosphor according to the present invention, a composition ratio of raw materials, that is, a composition ratio of $CaO:CeO_2:SiN_{4/3}$ is 1:1:4, however, a Rietveld analysis result shows that a composition ratio of Ca:Ce:Si is about 0.68:1.32:6, which is due to occurrence of non-crystalline phase, and in so far as a mixture has a monoclinic phase as a main phase by an XRD measurement result, even the mixture, which has such as a non-crystalline phase or other crystalline phase, may be also included in the phosphor according to the present invention.

As described above, a composition calculated from the Rietveld analysis result and a composition used in manufacturing are different from each other, but two compositions all may be included in a composition range claimed in the present invention. Here, the Rietveld method is a method that compares an X-ray diffraction intensity obtained from a real measurement and an X-ray diffraction intensity obtained through theoretical calculation from a crystal structure model constructed by predicting a crystal structure, and optimizes various structural parameters of the latter model through a least square method in order to reduce a difference between the two intensities, to derive a more accurate crystal structure model. In the Rietveld analysis, a program "Full-Prof" was used, and the phosphor of the inventor's previous application (Korea Patent Publication No. 2012-0110216) was used as a reference crystal structure.

The following Table 1 shows a Rierveld analysis result, and a value of S.O.F may be changed according to a composition range.

TABLE 1

| Atom | Wyckoff site | x/a | y/b | z/c | U (Å) | S.O.F. |
|---|---|---|---|---|---|---|
| Ce1 | 4c | 0.88837 (7) | 0.00000 | 0.40933 (10) | 0.0021 (2) | 0.81 |
| Ca1 | 4c | 0.88837 (7) | 0.00000 | 0.40933 (10) | 0.0021 (2) | 0.19 |
| Ce2 | 4c | 0.89896 (8) | -0.0395 (6) | 0.02812 (13) | 0.0128 (5) | 0.51 |
| Ca2 | 4c | 0.89896 (8) | -0.0395 (6) | 0.02812 (13) | 0.0128 (5) | 0.49 |
| Si1 | 4c | 0.8309 (3) | 0.4690 (18) | 0.1421 (4) | 0.0012 (4) | 1 |
| Si2 | 4c | 0.0663 (3) | 0.961 (2) | 0.2825 (4) | 0.0127 (16) | 1 |
| Si3 | 4c | 0.2639 (3) | -0.011 (3) | 0.8430 (4) | 0.0165 (14) | 1 |
| Si4 | 4c | 0.8391 (2) | 0.470 (2) | 0.6228 (4) | 0.0131 (13) | 1 |
| Si5 | 4c | 0.7355 (3) | 0.481 (3) | 0.3285 (4) | 0.0142 (13) | 1 |
| Si6 | 4c | 0.9982 (2) | 0.4609 (18) | 0.3501 (4) | 0.0035 (14) | 1 |
| N1 | 4c | 0.4676 (6) | 0.421 (4) | 0.8780 (9) | 0.034 (4) | 0.38 |
| O1 | 4c | 0.4676 (6) | 0.421 (4) | 0.8780 (9) | 0.034 (4) | 0.62 |
| N2 | 2b | 0.00000 | 0.336 (4) | 0.50000 | 0.037 (8) | 1 |
| N3 | 4c | 0.0867 (7) | 0.358 (2) | 0.7579 (10) | 0.003 (5) | 1 |
| N4 | 4c | 0.7344 (8) | 0.331 (3) | 0.1852 (12) | 0.026 (5) | 1 |
| N5 | 4c | 0.4179 (7) | 0.819 (2) | 0.6822 (11) | 0.003 (4) | 1 |
| N6 | 4c | 0.1593 (6) | 0.403 (3) | 0.0095 (10) | 0.003 (4) | 1 |
| N7 | 4c | 0.9892 (10) | 0.797 (3) | 0.6505 (13) | 0.038 (5) | 0.895 |
| O7 | 4c | 0.9892 (10) | 0.797 (3) | 0.6505 (13) | 0.038 (5) | 0.105 |
| N8 | 4c | 0.1560 (8) | 0.844 (3) | 0.3289 (12) | 0.014 (5) | 1 |
| N9 | 4c | 0.7002 (6) | 0.921 (3) | 0.5510 (9) | 0.027 (5) | 0.125 |
| O9 | 4c | 0.7002 (6) | 0.921 (3) | 0.5510 (9) | 0.027 (5) | 0.875 |
| N10 | 4c | 0.2225 (8) | 0.322 (3) | 0.3115 (14) | 0.028 (5) | 1 |
| N11 | 4c | 0.3167 (7) | 0.303 (2) | 0.1733 (11) | 0.019 (4) | 0.42 |
| O11 | 4c | 0.3167 (7) | 0.303 (2) | 0.1733 (11) | 0.019 (4) | 0.58 |

The mean particle size of the phosphor according to the present invention is preferably in a range of 1 μm to 20 μm. When the mean particle size is less than 1 μm, a light absorbing ratio due to scattering may be reduced, and homogeneous dispersion in a resin for sealing an LED may be difficult. When the mean particle size exceeds 20 μm, the light-emitting intensity and the color of the phosphor may become non-uniform.

Method for Manufacturing Phosphor

A method of manufacturing a phosphor according to the present invention will be described in detail.

Silicon nitride ($Si_3N_4$), calcium oxide (CaO), cerium oxide, lanthanum oxide (LaO), praseodymium oxide ($PrO_2$) and europium oxide ($Eu_2O_3$) powders were used as raw materials for manufacturing a phosphor when Si, Ca, Ce, La, Pr and Eu are used as main components.

The raw materials of CaO, $CeO_2$, $La_2O_3$, $PrO_2$ and a-$Si_3N_4$ were weighed and mixed so as to obtain a predetermined composition. At this time, the amount of the mixture per sample was 1.5 g. Also, the raw material of the activator was added in a molar ratio of 0.03 with respect to Ca, Ce, La and Pr.

The mixing process of the raw materials as described above was conducted manually for 10 minutes under an atmosphere.

A baking process of the obtained mixture samples was conducted under a nitrogen gas atmosphere that includes a nitrogen gas having a pressure of atmospheric pressure to 20 atm as a main component and 0 to 25% of a $H_2$ gas. When the baking is performed under the nitrogen gas atmosphere, a decomposition of nitride synthesized during the baking at a high temperature may be prevented or suppressed, and a composition deviation of nitride generated may be reduced to manufacture a phosphor composition having excellent performance. Here, inclusion of the nitrogen gas as the main component means that 75% or more of the nitrogen gas with respect to the total amount of gases is included. Also, a baking temperature is preferably in the range of 1,300° C. to 1,800° C., and is more preferably 1,500° C. or more in order to obtain a high quality phosphor. In addition, baking time may be in a range of 30 minutes to 100 hours, and in consideration of quality and productivity, the banking time is preferably in a range of 2 hours to 8 hours.

In Examples of the present invention, the baking was conducted under a high purity nitrogen gas atmosphere (99.999%) having atmospheric pressure at a banking temperature of 1,500° C. for 2 hours, and a pulverizing process was conducted to manufacture the phosphor.

Hereinafter, the present invention will be described in more detail with reference to preferred Examples of the present invention.

The following Examples 1 to 15 are to confirm the difference of light-emitting properties when a host material includes Ca, Ce and Si, and when a portion of Ce composing the host material is replaced with La and/or Pr. Also, Comparative Example 1 is to compare a phosphor composition, disclosed in the inventor's previous Application (Korea Patent Publication No. 2012-0110216), having the same crystal structure as Examples of the present invention and Examples 1 to 5 of the present invention. Also, Comparative Examples 2 to 6 are to confirm differences between light-emitting properties when a host material includes Ca, Pr and Si, and when a portion of Pr composing the host material is replaced with La, and light-emitting properties of Examples of the present invention.

Example 1

After respectively weighing 0.1350 g of CaO, 0.4019 g of $CeO_2$, 0.4503 g of a-$Si_3N_4$ and 0.0127 g of $Eu_2O_3$, as raw material powders of the phosphor composition of Example 1, the raw materials were manually mixed by using a mortar and a pestle under an atmosphere to obtain 1.0 g of a raw material powder mixture.

1.0 g of the raw material powder mixture as mixed above was charged into a crucible, a nitrogen gas was injected into a baking furnace to make a nitrogen atmosphere having atmospheric pressure, and a baking treatment was conducted by heating at 1,600° C. for 6 hours. After the baking treatment was conducted, a pulverizing process was performed to obtain a phosphor composition. The obtained phosphor composition was confirmed to have a central light-emitting peak of 569 nm when an excitation source having a wavelength of 460 nm was used.

Example 2

After respectively weighing 0.1356 g of CaO, 0.3229 g of $CeO_2$, 0.0764 g of $La_2O_2$, 0.4523 g of a-$Si_3N_4$ and 0.0128 g of $Eu_2O_3$, as raw material powders of the phosphor composition of Example 2, the raw materials were manually mixed by using a mortar and a pestle under an atmosphere to obtain 1.0 g of a raw material powder mixture. After that, the same procedures as described in Example 1 were conducted to obtain a phosphor composition. The obtained phosphor composition was confirmed to have a central light-emitting peak of 567 nm when an excitation source having a wavelength of 460 nm was used.

Example 3

After 0.1362 g of CaO, 0.2433 g of $CeO_2$, 0.1535 g of $La_2O_3$, 0.4542 g of a-$Si_3N_4$ and 0.0129 g of $Eu_2O_2$ were respectively weighed as raw material powders of the phosphor composition of Example 3, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 567 nm when an excitation source having a wavelength of 460 nm was used.

Example 4

After 0.1368 g of CaO, 0.1629 g of $CeO_2$, 0.2312 g of $La_2O_3$, 0.4562 g of a-$Si_3N_4$ and 0.0129 g of $Eu_2O_3$ were respectively weighed as raw material powders of the phosphor composition of Example 4, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 565 nm when an excitation source having a wavelength of 460 nm was used.

Example 5

After 0.1374 g of CaO, 0.0818 g of $CeO_2$, 0.3097 g of $La_2O_3$, 0.4582 g of a-$Si_3N_4$ and 0.0130 g of $Eu_2O_3$ were respectively weighed as raw material powders of the phosphor composition of Example 5, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 560 nm when an excitation source having a wavelength of 460 nm was used.

Example 6

After 0.1351 g of CaO, 0.3218 g of $CeO_2$, 0.0796 g of $PrO_2$, 0.4507 g of $a-Si_3N_4$ and 0.0128 g of $Eu_2O_3$ were respectively weighed as raw material powders of the phosphor composition of Example 6, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 546 nm when an excitation source having a wavelength of 460 nm was used.

Example 7

After 0.1352 g of CaO, 0.2416 g of $CeO_2$, 0.1593 g of $PrO_2$, 0.4511 g of $a-Si_3N_4$ and 0.0128 g of $Eu_2O_3$ were respectively weighed as raw material powders of the phosphor composition of Example 7, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 541 nm when an excitation source having a wavelength of 460 nm was used.

Example 8

After 0.1354 g of CaO, 0.1612 g of $CeO_2$, 0.2392 g of $PrO_2$, 0.4515 g of $a-Si_3N_4$ and 0.0128 g of $Eu_2O_3$ were respectively weighed as raw material powders of the phosphor composition of Example 8, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 541 nm when an excitation source having a wavelength of 460 nm was used.

Example 9

After 0.1355 g of CaO, 0.0807 g of $CeO_2$, 0.3192 g of $PrO_2$, 0.4519 g of $a-Si_3N_4$ and 0.0128 g of $Eu_2O_3$ were respectively weighed as raw material powders of the phosphor composition of Example 9, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 520 nm when an excitation source having a wavelength of 460 nm was used.

Example 10

After 0.1357 g of CaO, 0.0765 g of $La_2O_3$, 0.2424 g of $CeO_2$, 0.0799 g of $PrO_2$, 0.4527 g of $a-Si_3N_4$ and 0.0128 g of $Eu_2O_3$ were respectively weighed as raw material powders of the phosphor composition of Example 10, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 547 nm when an excitation source having a wavelength of 460 nm was used.

Example 11

After 0.1363 g of CaO, 0.1536 g of $La_2O_3$, 0.1623 g of $CeO_2$, 0.0803 g of $PrO_2$, 0.4546 g of $a-Si_3N_4$ and 0.0129 g of $Eu_2O_3$ were respectively weighed as raw material powders of the phosphor composition of Example 11, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 547 nm when an excitation source having a wavelength of 460 nm was used.

Example 12

After 0.1369 g of CaO, 0.2314 g of $La_2O_3$, 0.0815 g of $CeO_2$, 0.0806 g of $PrO_2$, 0.4566 g of $a-Si_3N_4$ and 0.0129 g of $Eu_2O_3$ were respectively weighed as raw material powders of the phosphor composition of Example 12, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 548 nm when an excitation source having a wavelength of 460 nm was used.

Example 13

After 0.1364 g of CaO, 0.1538 g of $La_2O_3$, 0.0812 g of $CeO_2$, 0.1607 g of $PrO_2$, 0.4550 g of $a-Si_3N_4$ and 0.0129 g of $Eu_2O_3$ were respectively weighed as raw material powders of the phosphor composition of Example 13, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 540 nm when an excitation source having a wavelength of 460 nm was used.

Example 14

After 0.1358 g of CaO, 0.0765 g of $La_2O_3$, 0.1618 g of $CeO_2$, 0.1600 g of $PrO_2$, 0.4531 g of $a-Si_3N_4$ and 0.0128 g of $Eu_2O_3$ were respectively weighed as raw material powders of the phosphor composition of Example 14, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 544 nm when an excitation source having a wavelength of 460 nm was used.

Example 15

After 0.1359 g of CaO, 0.0766 g of $La_2O_3$, 0.0809 g of $CeO_2$, 0.2402 g of $PrO_2$, 0.4535 g of $a-Si_3N_4$ and 0.0128 g of $Eu_2O_3$ were respectively weighed as raw material powders of the phosphor composition of Example 15, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 532 nm when an excitation source having a wavelength of 460 nm was used.

Comparative Example 1

After 0.1380 g of CaO, 0.3888 g of $La_2O_3$, 0.4602 g of $a-Si_3N_4$ and 0.0130 g of $Eu_2O_3$ were respectively weighed as raw material powders of the phosphor composition of Comparative Example 1, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 560 nm when an excitation source having a wavelength of 460 nm was used.

Comparative Example 2

After 0.1375 g of CaO, 0.3099 g of $La_2O_3$, 0.0810 g of $PrO2$ 0.4586 g of $a-Si_3N_4$ and 0.0130 g of $Eu_2O_3$ were respectively weighed as raw material powders of the phosphor composition of Comparative Example 2, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 547 nm when an excitation source having a wavelength of 460 nm was used.

Comparative Example 3

After 0.1370 g of CaO, 0.2317 g of $La_2O_3$, 0.1614 g of $PrO_2$ 0.4570 g of $a-Si_3N_4$, 0.0129 g of $Eu_2O_3$ were respectively weighed as raw material powders of the phosphor composition of Comparative Example 3, the raw materials were manually mixed by using a mortar and a pestle under atmosphere to obtain 1.0 g of a raw material powder mixture. After that, the same procedures as described in Example 1 were conducted to obtain a phosphor composition. The obtained phosphor composition was confirmed to have a central light-emitting peak of 544 nm when an excitation source having a wavelength of 460 nm was used.

Comparative Example 4

After 0.1365 g of CaO, 0.1539 g of $La_2O_3$, 0.2412 g of $PrO_2$, 0.4554 g of $a-Si_3N_4$ and 0.0129 g of $Eu_2O_2$ were respectively weighed as raw material powders of the phosphor composition of Comparative Example 4, the raw materials were manually mixed by using a mortar and a pestle under atmosphere to obtain 1.0 g of a raw material powder mixture. After then, the same procedures as described in Example 1 were conducted to obtain a phosphor composition. The obtained phosphor composition was confirmed to have a central light-emitting peak of 539 nm when an excitation source having a wavelength of 460 nm was used.

Comparative Example 5

After 0.1361 g of CaO, 0.0767 g of $La_2O_3$, 0.3205 g of $PrO_2$, 0.4539 g of $a-Si_3N_4$ and 0.0128 g of $Eu_2O_2$ were respectively weighed as raw material powders of the phosphor composition of Comparative Example 5, the raw materials were manually mixed by using a mortar and a pestle under atmosphere to obtain 1.0 g of a raw material powder mixture. After then, the same procedures as described in Example 1 were conducted to obtain a phosphor composition. The obtained phosphor composition was confirmed to have a central light-emitting peak of 519 nm when an excitation source having a wavelength of 460 nm was used.

Comparative Example 6

After 0.1356 g of CaO, 0.3993 g of $PrO_2$, 0.4523 g of $a-Si_3N_4$ and 0.0128 g of $Eu_2O_2$ were respectively weighed as raw material powders of the phosphor composition of Comparative Example 6, the raw materials were manually mixed by using a mortar and a pestle under atmosphere to obtain 1.0 g of a raw material powder mixture. After then, the same procedures as described in Example 1 were conducted to obtain a phosphor composition. The obtained phosphor composition was confirmed to have a central light-emitting peak of 513 nm when an excitation source having a wavelength of 460 nm was used.

Crystal structures of phosphor compositions according to Examples 1 to 15 of the present invention as manufactured above were analyzed through an XRD.

Figure 1:
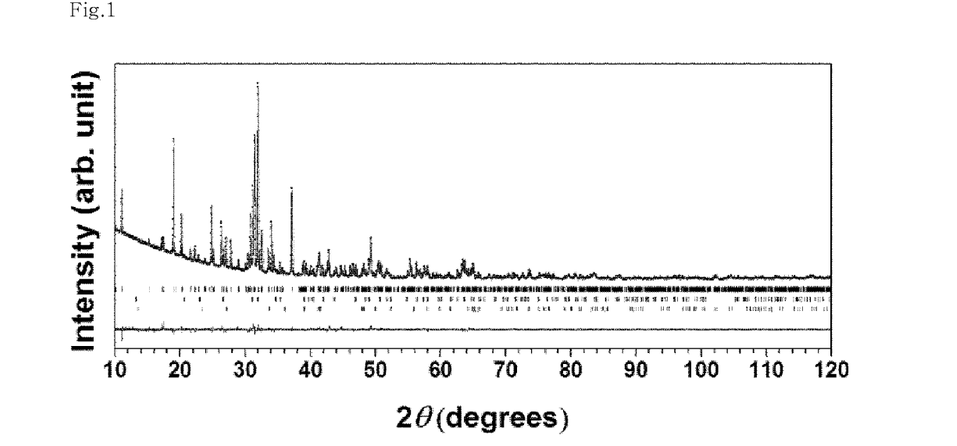
FIG. 1 is a diagram showing an XRD analysis result of a phosphor manufactured according to Example 1 of the present invention.

FIG. 1 is a diagram illustrating an XRD analysis result of a phosphor manufactured according to Example 1 of the present invention, and impurities confirmed as α-silicon nitride and β-silicon nitride, exist in an extremely small amount, and their Bragg diffraction positions and a Brag diffraction position of a main phase are disposed under an XRD pattern of the main phase.

Figure 2:
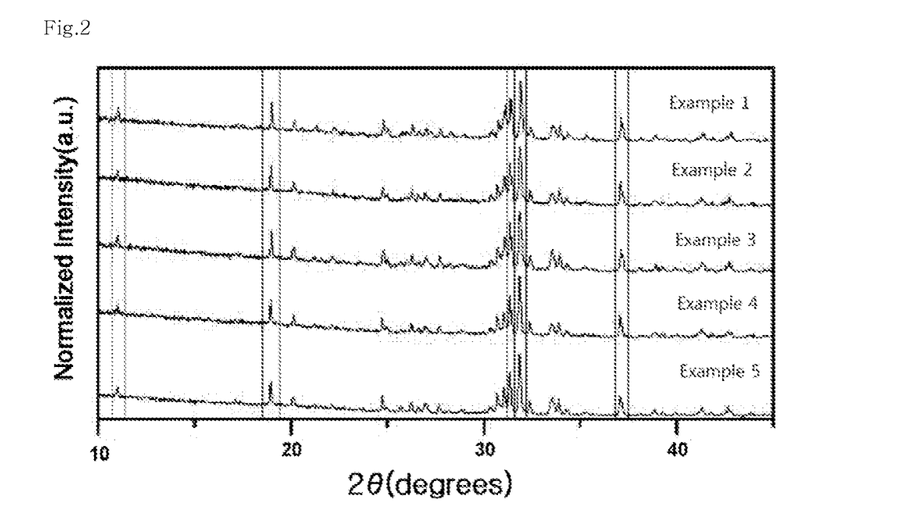
FIG. 2 is a diagram showing XRD analysis results of Examples 1 to 5 of the present invention.

FIG. 2 is a diagram illustrating XRD analysis results of phosphors manufactured according to Examples 1 to 5 of the present invention. As seen from FIG. 2, the phosphors manufactured according to Examples 1 to 5 exhibit a diffraction peak having a relative intensity of 5% or more in ranges of Bragg angles (2θ) of 10.68° to 11.41°, 18.52° to 19.46°, 31.21° to 31.58°, 31.61° to 32.20°, and 36.81° to 37.49° (a region represented as vertical lines in FIG. 2) of an X-ray diffraction pattern when a relative intensity of the most intensive diffraction peak in the powder X-ray diffraction pattern is stet to 100%. Although X-ray diffraction patterns of other Examples of the present invention are not shown, it has been confirmed that other Examples exhibit the same pattern as Examples 1 to 5.

Also, XRD analysis results of powder with respect to a crystal structure of phosphor according to Examples of the present invention are shown in the following Table 2.

TABLE 2

| Examples | a | b | c | α | β | γ |
| --- | --- | --- | --- | --- | --- | --- |
| 1 | 18.4882 | 4.83587 | 10.67235 | 90 | 108.242 | 90 |
| 2 | 18.4975 | 4.8351 | 10.6777 | 90 | 108.224 | 90 |
| 3 | 18.5260 | 4.8371 | 10.6909 | 90 | 108.232 | 90 |
| 4 | 18.5021 | 4.8378 | 10.6853 | 90 | 108.228 | 90 |

TABLE 2-continued

| Examples | a | b | c | α | β | γ |
|---|---|---|---|---|---|---|
| 5 | 18.5208 | 4.8407 | 10.6945 | 90 | 108.225 | 90 |
| 6 | 18.4768 | 4.8357 | 10.6709 | 90 | 108.199 | 90 |
| 7 | 18.4694 | 4.8374 | 10.6703 | 90 | 108.195 | 90 |
| 8 | 18.4590 | 4.8381 | 10.6674 | 90 | 108.196 | 90 |
| 9 | 18.4390 | 4.8351 | 10.6578 | 90 | 108.198 | 90 |
| 10 | 18.4803 | 4.8375 | 10.6744 | 901 | 108.190 | 90 |
| 11 | 18.5010 | 4.8407 | 10.6852 | 90 | 108.183 | 90 |
| 12 | 18.4969 | 4.8412 | 10.6856 | 90 | 108.198 | 90 |
| 13 | 18.4728 | 4.8370 | 10.6718 | 90 | 108.192 | 90 |
| 14 | 18.4880 | 4.8399 | 10.6797 | 90 | 108.189 | 90 |
| 15 | 18.4549 | 4.8373 | 10.665310 | 90 | 108.192 | 90 |

From Table 2 and a result of a profile matching, it may be seen that the phosphors according to Examples 1 to 15 of the present invention show that in consideration of a=18.4882 Å, b=4.83587 Å, c=10.67235 Å, α=γ=90°, and β=108.2424° as reference values, the a, b, c and β values are changed in a range of ±5% or less from the reference values.

That is, it has been confirmed that the phosphors according to Examples 1 to 15 of the present invention have a monoclinic crystal structure, and the phosphor having such a monoclinic crystal structure has been unknown until now except for the phosphor composition disclosed in the inventor's previous Application (Korea Patent Application No. 2011-0027932).

Figure 3:
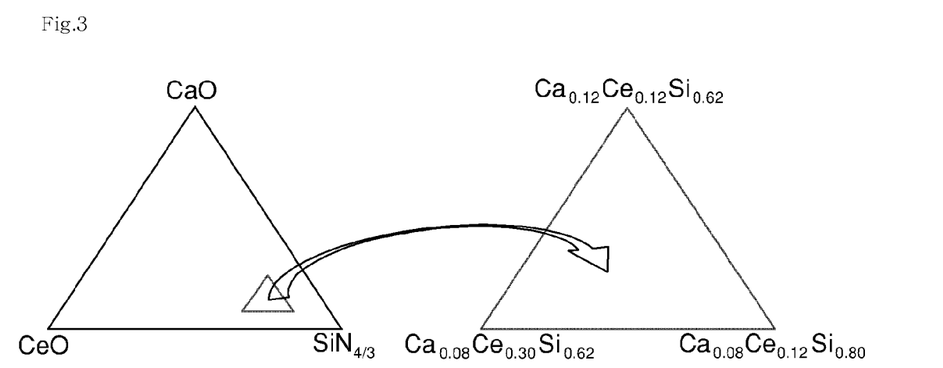
FIG. 3 is a diagram showing a composition range for realizing a phosphor that has a monoclinic crystal structure according to the present invention.

FIG. 3 is a diagram showing a composition range for realizing a phosphor that has a monoclinic crystal structure according to the present invention, an inner triangle of FIG. 3 represents a composition range capable of substantially obtaining a single phase having a monoclinic crystal structure according to the present invention, and if deviating from the composition range, a single phase having a crystal structure like a phosphor according to the present invention is unobtainable.

Table 3 summarizes measurement results of raw material mixture proportions and light-emitting intensities of manufactured phosphors according to Examples 1 to 15 of the present invention and Comparative Examples 1 to 6.

As confirmed from Table 3, it may be seen that Examples 1 to 5 (sample numbers 1 to 5) have an excellent light-emitting intensity compared to other Examples (Examples 6 to 15) of the present invention and Comparative Examples 2 to 6 (except for Comparative 1 (samples 1 to 5)), and especially, are suitably applicable to a light-emitting device such as an LED.

Figure 4:
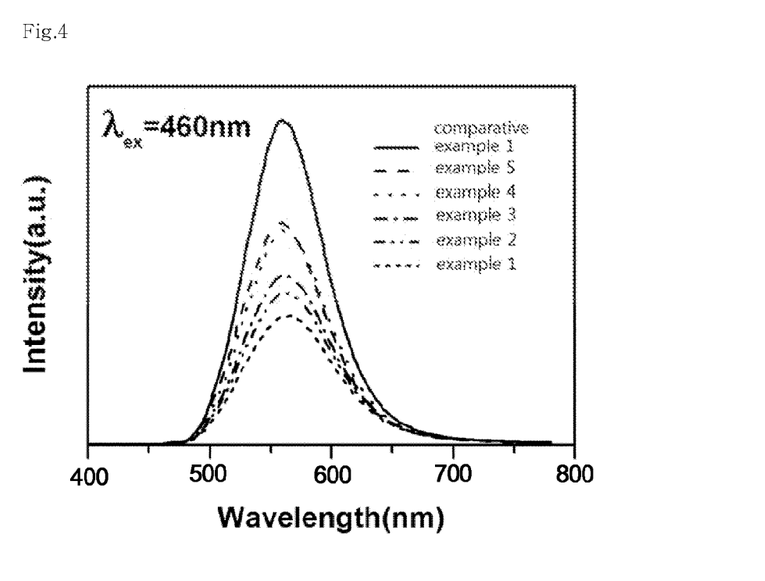
FIG. 4 is a diagram showing a difference of a light-emitting property according to a content of La and Ce.
Figure 5:
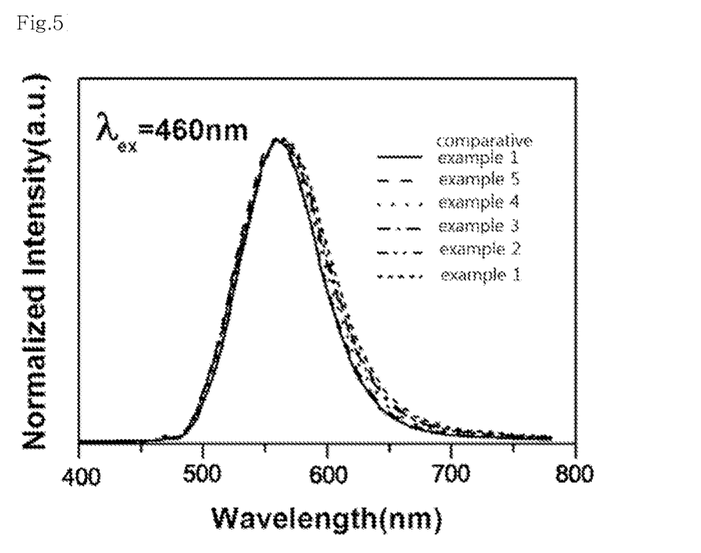
FIG. 5 is a diagram showing a normalized result with respect to a light-emitting intensity of FIG. 4.

FIGS. 4 and 5 are diagrams showing light-emitting intensities and normalized intensities of Examples 1 to 5 of the present invention and Comparative Example 1 that is a composition in the inventor's prior Application Patent.

From FIG. 4, it may be seen that Examples 1 to 5 of the present invention have a little low light-emitting intensity compared to Example 1, and shows that the less a content of La replacing Ce, a light-emitting intensity is lower. However, in consideration of an improvement of a light-emitting intensity through a subsequent powder treating process, Examples 1 to 5 of the present invention may be considered to have a light-emitting intensity applicable to industry.

Meanwhile, as conformed in FIG. 5, as a content of Ce is higher, a width of a light-emitting peak is wider. That is, Example 1 of the present invention have a light-emitting peak that is considerably wider than that of Comparative Example 1, such a property increase the possibility of applying phosphors according to Examples 1 to 5 of the present invention to, for example, a device such as an LED, so it is preferable property.

Also, as seen from FIG. 3, when Ce is replaced with Pr, a light-emitting intensity is considerably reduced, which is not preferable, and it may be seen that Pr be added in a molar ratio of 0.1 or less with the host material.

Figure 6:
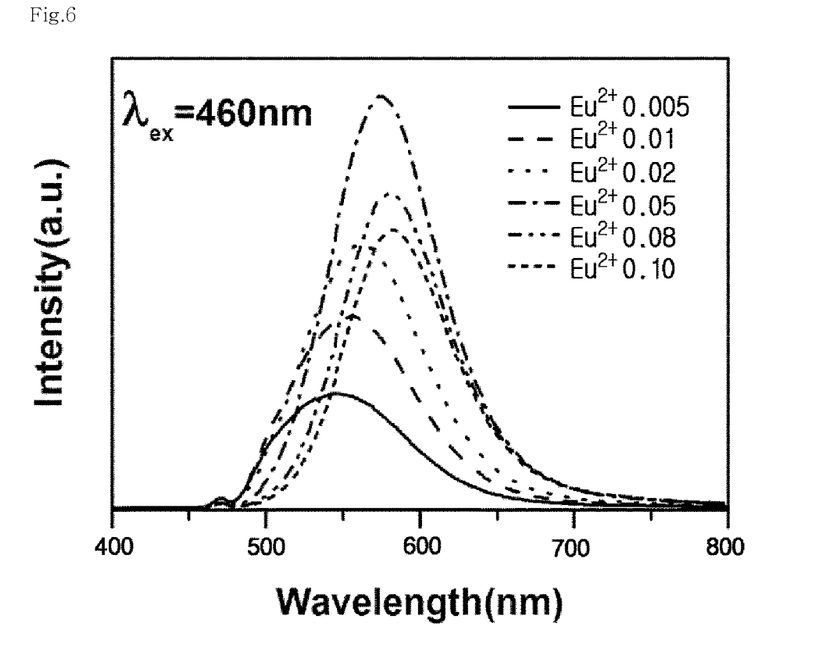
FIG. 6 is a diagram showing light-emitting properties of phosphors according to an amount of $Eu^{2+}$ that doped into a host material of Example 1.

FIG. 6 is a diagram showing light-emitting properties of phosphors according to an amount of $Eu^{2+}$ that doped into a host material of Example 1. As seen from FIG. 6, when Eu is added in a molar ratio of 0.05 with the host material, the most excellent light-emitting intensity is shown, and it may be seen that Eu be most preferably doped in a molar ratio of 0.02 to 0.10 with the host material.

TABLE 3

| Sample Number | Central Intensity | wavelength | Composition (Molar Ration) | | | | | Mixing Ratio of Raw Materials (g) | | | | | |
|---|---|---|---|---|---|---|---|---|---|---|---|---|---|
| | | | Ca | Ce | La | Pr | Si | CaO | $CeO_2$ | $La_2O_3$ | $PrO_2$ | $Si_3N_4$ | $Eu_2O_3$ |
| 1 | 8966.4 | 569 nm | 1 | 1 | 0 | 0 | 4 | 0.1350 | 0.4019 | 0.0000 | 0.0000 | 0.4503 | 0.0127 |
| 2 | 11004.8 | 567 nm | 1 | 0.8 | 0.2 | 0 | 4 | 0.1356 | 0.3229 | 0.0764 | 0.0000 | 0.4523 | 0.0128 |
| 3 | 13002.6 | 567 nm | 1 | 0.6 | 0.4 | 0 | 4 | 0.1362 | 0.2433 | 0.1535 | 0.0000 | 0.4542 | 0.0129 |
| 4 | 14293.6 | 565 nm | 1 | 0.4 | 0.6 | 0 | 4 | 0.1368 | 0.1629 | 0.2312 | 0.0000 | 0.4562 | 0.0129 |
| 5 | 18150.5 | 560 nm | 1 | 0.2 | 0.8 | 0 | 4 | 0.1374 | 0.0818 | 0.3097 | 0.0000 | 0.4582 | 0.0130 |
| 6 | 1678 | 546 nm | 1 | 0.8 | 0 | 0.2 | 4 | 0.1351 | 0.3218 | 0.0000 | 0.0796 | 0.4507 | 0.0128 |
| 7 | 676.4 | 541 nm | 1 | 0.6 | 0 | 0.4 | 4 | 0.1352 | 0.2416 | 0.0000 | 0.1593 | 0.4511 | 0.0128 |
| 8 | 342.4 | 541 nm | 1 | 0.4 | 0 | 0.6 | 4 | 0.1354 | 0.1612 | 0.0000 | 0.2392 | 0.4515 | 0.0128 |
| 9 | 151 | 520 nm | 1 | 0.2 | 0 | 0.8 | 4 | 0.1355 | 0.0807 | 0.0000 | 0.3192 | 0.4519 | 0.0128 |
| 10 | 1898.8 | 547 nm | 1 | 0.6 | 0.2 | 0.2 | 4 | 0.1357 | 0.2424 | 0.0765 | 0.0799 | 0.4527 | 0.0128 |
| 11 | 2014 | 547 nm | 1 | 0.4 | 0.4 | 0.2 | 4 | 0.1363 | 0.1623 | 0.1536 | 0.0803 | 0.4546 | 0.0129 |
| 12 | 2550.1 | 548 nm | 1 | 0.2 | 0.6 | 0.2 | 4 | 0.1369 | 0.0815 | 0.2314 | 0.0806 | 0.4566 | 0.0129 |
| 13 | 759.9 | 540 nm | 1 | 0.2 | 0.4 | 0.4 | 4 | 0.1364 | 0.0812 | 0.1538 | 0.1607 | 0.4550 | 0.0129 |
| 14 | 707.3 | 544 nm | 1 | 0.4 | 0.2 | 0.4 | 4 | 0.1358 | 0.1618 | 0.0765 | 0.1600 | 0.4531 | 0.0128 |
| 15 | 328.3 | 532 nm | 1 | 0.2 | 0.2 | 0.6 | 4 | 0.1359 | 0.0809 | 0.0766 | 0.2402 | 0.4535 | 0.0128 |
| Comparative Ex. 1 | 20940.7 | 560 nm | 1 | 0 | 1 | 0 | 4 | 0.1380 | 0.0000 | 0.3888 | 0.0000 | 0.4602 | 0.0130 |
| Comparative Ex. 2 | 3242.8 | 547 nm | 1 | 0 | 0.8 | 0.2 | 4 | 0.1375 | 0.0000 | 0.3099 | 0.0810 | 0.4586 | 0.0130 |
| Comparative Ex. 3 | 890.4 | 544 nm | 1 | 0 | 0.6 | 0.4 | 4 | 0.1370 | 0.0000 | 0.2317 | 0.1614 | 0.4570 | 0.0129 |
| Comparative Ex. 4 | 345.2 | 539 nm | 1 | 0 | 0.4 | 0.6 | 4 | 0.1365 | 0.0000 | 0.1539 | 0.2412 | 0.4554 | 0.0129 |
| Comparative Ex. 5 | 153.8 | 519 nm | 1 | 0 | 0.2 | 0.8 | 4 | 0.1361 | 0.0000 | 0.0767 | 0.3205 | 0.4539 | 0.0128 |
| Comparative Ex. 6 | 99.5 | 513 nm | 1 | 0 | 0 | 1 | 4 | 0.1356 | 0.0000 | 0.0000 | 0.3993 | 0.4523 | 0.0128 |

Figure 7:
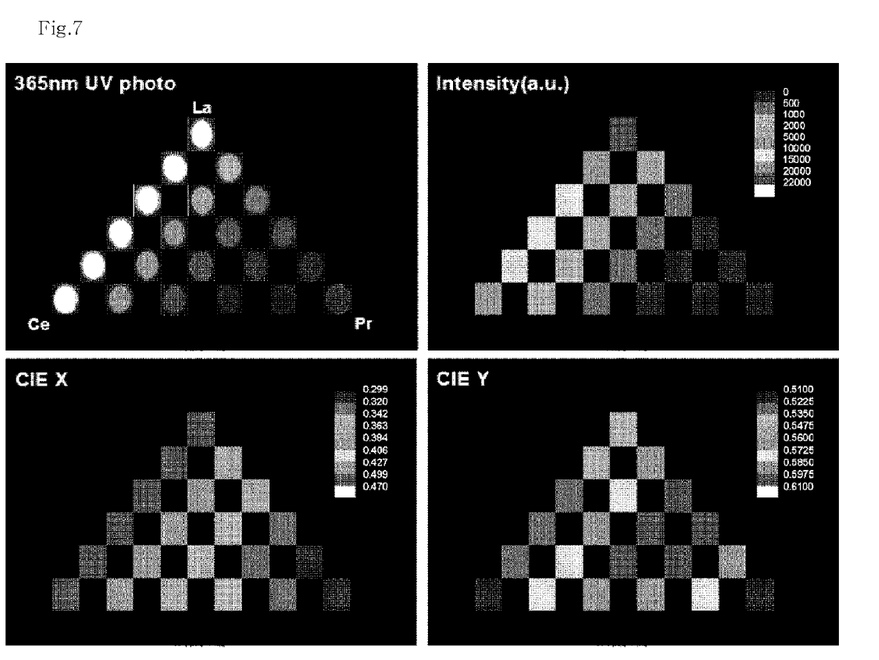
FIG. 7 shows, through a ternary composition expression method, photographs, relative light-emitting intensities and CIE color purity values after an ultraviolet ray is irradiated on real phosphors of Examples 1 to 15 and Comparative Examples 1 to 5 by using an ultraviolet ray lamp.

FIG. 7 shows, through a ternary composition expression method, photographs, relative light-emitting intensities and CIE color purity values after an ultraviolet ray is irradiated on real phosphors of Examples 1 to 15 and Comparative Examples 1 to 5 by using an ultraviolet ray lamp. As shown in FIG. 7, it may be seen that Examples 1 to 5 of the present invention exhibit the most excellent light-emitting intensity.

The invention claimed is:

1. A phosphor comprising:
a host material expressed by a general formula $(Ca_{1-x}Me_x)_a(Ce_{1-y-z}La_yPr_z)_bSi_cX_d$ ($0.5 \leq b/a \leq 7$, $1.5 \leq c/(a+b) \leq 3.5$, $4 \leq d/(a+b) \leq 6$, $0 \leq x \leq 0.5$, $0 \leq y < 1$, $0 \leq z \leq 0.5$, and $0 y+z<1$, wherein X is at least one element selected from N, O, F, and Cl); and
at least one activator that is selected from Mn, Ce, Pr, Nd, Sm, Eu, Gd, Dy, Tb, Ho, Er, and Tm, and is solid-solutioned in the host material,
wherein Me is at least one element selected from Ba, Mg, Sr, Mn, and Zn, and
wherein the host material comprises, as a main phase, a phase that exhibits a diffraction peak having a relative intensity of 5% or more in ranges of Bragg's angles (2θ) of 10.68-11.41°, 18.52-19.46°, 31.21-31.58°, 31.61-32.20°, and 36.81-37.49° of a powder X-ray diffraction pattern when a relative intensity of a diffraction peak having the strongest intensity is set to 100% in the powder X-ray diffraction pattern.

2. The phosphor of claim 1, wherein the main phase has a crystal structure of a monoclinic system.

3. The phosphor of claim 1, wherein the host material has a crystal lattice that has reference values of $a=18.4882$ Å, $b=4.83587$ Å, $c=10.67235$ Å, $\alpha=\gamma=90°$, and $\beta=108.2424°$ according to a peak of the powder X-ray diffraction pattern,
wherein the a, b, c and β values are changed in a range of ±5% or less from the reference values.

4. The phosphor of claim 1, the "b" is 0.8a to 2a, and the "c" is 1.8(a+b) to 3.2(a+b).

5. The phosphor of claim 1, wherein the "X" comprises O and N,
wherein a molar ratio (N/O) of the O and N is a range of 4 to 8.

6. The phosphor of claim 1, wherein the activator comprises Eu.

7. The phosphor of claim 1, wherein the "x" is 0 to 0.1, and the "z" is 0 to 0.5.

8. The phosphor of claim 1, wherein the activator is included in a molar ratio of 0.1 with respect to the host material.

9. The phosphor of any one of claim 1, wherein the phosphor emits light having a wavelength of 500 nm to 600 nm when an excitation source having a wavelength of 360 nm to 500 nm is irradiated thereon.

10. A light-emitting device comprising the phosphor of claim 1.

* * * * *